(12) United States Patent
Chiang

(10) Patent No.: US 7,993,712 B2
(45) Date of Patent: Aug. 9, 2011

(54) HOUSING AND SURFACE TREATING METHOD FOR MAKING THE SAME

(75) Inventor: Chwan-Hwa Chiang, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 699 days.

(21) Appl. No.: 11/966,971

(22) Filed: Dec. 28, 2007

(65) Prior Publication Data

US 2009/0110854 A1    Apr. 30, 2009

(30) Foreign Application Priority Data

Oct. 25, 2007   (CN) ......................... 2007 1 0202271

(51) Int. Cl.
| A47G 19/22 | (2006.01) |
| B28B 11/00 | (2006.01) |
| B28B 21/00 | (2006.01) |
| B28B 21/72 | (2006.01) |
| B28B 23/08 | (2006.01) |
| B29D 22/00 | (2006.01) |
| B29D 23/00 | (2006.01) |
| B32B 1/08 | (2006.01) |
| F16L 9/10 | (2006.01) |

(52) U.S. Cl. .................. 428/34.4; 428/34.6; 428/34.7; 428/35.7; 428/35.8; 428/213; 455/575.8; 455/575.1; 379/428.01

(58) Field of Classification Search ................ 428/35.7, 428/35.8, 35.9, 76, 77, 34.4, 34.6, 34.7, 213; 455/575.8, 575.1; 379/428.01
See application file for complete search history.

(56) References Cited

U.S. PATENT DOCUMENTS

| 5,268,404 | A | 12/1993 | Mowrey |
| 2006/0213587 | A1 * | 9/2006 | Shiflet et al. .................. 148/403 |

FOREIGN PATENT DOCUMENTS

| JP | 2001315162 A | * | 11/2001 |
| JP | 2004134722 A | | 4/2004 |
| JP | 2007138257 A | * | 6/2007 |
| TW | 505563 | | 10/2002 |
| TW | 200714464 A | | 4/2007 |

* cited by examiner

*Primary Examiner* — Michael C Miggins
(74) *Attorney, Agent, or Firm* — Frank R. Niranjan

(57) ABSTRACT

An exemplary housing includes a metallic glass main body; and two coatings formed on the metallic glass main body. The coatings include an adhesive layer on the metallic glass main body, and an outer layer formed on the adhesive layer. Surface treating methods for making present housing are also provided.

12 Claims, 3 Drawing Sheets

HOUSING AND SURFACE TREATING METHOD FOR MAKING THE SAME

This application is related to two co-pending U.S. patent applications, which are: application Ser. No. 11/966,969 and 11/966,970, and both entitled "HOUSING AND SURFACE TREATING METHOD FOR MAKING THE SAME". In all these co-pending applications, the inventor is Chwan-Hwa Chiang. All of the co-pending applications have the same assignee as the present application. The disclosures of the above identified applications are incorporated herein by reference.

BACKGROUND OF THE INVENTION

1. Field of the Invention

The present invention generally relates to housings, and particularly, to a housing used in electronic devices, and a surface treating method for making the housing.

2. Discussion of the Related Art

In recent years, there has been an increase in demand for portable electronic devices, such as personal digital assistants (PDAs), mobile phones, MP3 players and MP4 players. To make the portable electronic devices more physically appealing, the housings of the portable electronic devices may be decorated to have difference appearances.

Generally, the housings that exhibit metallic appearances are prepared by aluminum alloy, magnesium alloy or stainless steel. However, even if the aluminum alloy, magnesium alloy or stainless steel has a relatively high surface hardness, the housings may still be easily deformed and/or scratched when use. Furthermore, the aluminum alloy, magnesium alloy or stainless steel has relatively high chemical activity, thus when the portable electronic device is used, the housings would be oxidized or corroded, thereby causing the appearance of the housings to degrade.

Metallic glasses, unlike conventional crystalline alloys, have an amorphous or disordered atomic-scale structure that gives them unique properties, such as higher surface hardness, better anti-corrosion relative to the conventional crystalline alloys. Thus many of housings made of metallic glasses have been used in the portable electronic devices. However, the appearance of the housings made of metallic glasses is not physically appealing. Furthermore, a softness of the housing made of metallic glasses is relatively low-grade. In order to enhance the softness of the housing made of the metallic glasses with improving the appearance, generally, a transparent paint is coated on a surface of the metallic glasses to form an outer layer. However, after a relatively long time, the outer layer would break off from the surface of the metallic glasses, thus the appearance of the housing is seriously influenced.

Therefore, a new housing and surface treating methods for making the housing are desired in order to overcome the above-described shortcomings.

SUMMARY

A housing includes a metallic glass main body; and at least two coatings formed on the metallic glass main body. The coatings include an adhesive layer on the metallic glass main body, and an outer layer formed on the adhesive layer.

A surface treating method for making a housing having a metallic glass main body, includes: coating an adhesive on the metallic glass main body to form an adhesive layer; and coating a lacquer on the adhesive layer to form an outer layer.

Another surface treating method for making a housing having a metallic glass main body, includes: coating a primer on the metallic glass main body to form a bottom layer; forming a plating layer on the bottom layer; coating an adhesive on the plating layer to form an adhesive layer; and coating a lacquer on the adhesive layer to form an outer layer.

Other novel features will become more apparent from the following detailed description, when taken in conjunction with the accompanying drawings.

BRIEF DESCRIPTION OF THE DRAWINGS

The components in the drawings are not necessarily drawn to scale, the emphasis instead being placed upon clearly illustrating the principles of the present housing and surface treating methods for making the housing. Moreover, in the drawings, like reference numerals designate corresponding parts throughout several views, and all the views are schematic.

DETAILED DESCRIPTION OF THE EMBODIMENTS

Reference will now be made to the drawings to describe preferred embodiments of the present housing and surface treating methods for making the housing in detail.

Figure 1:
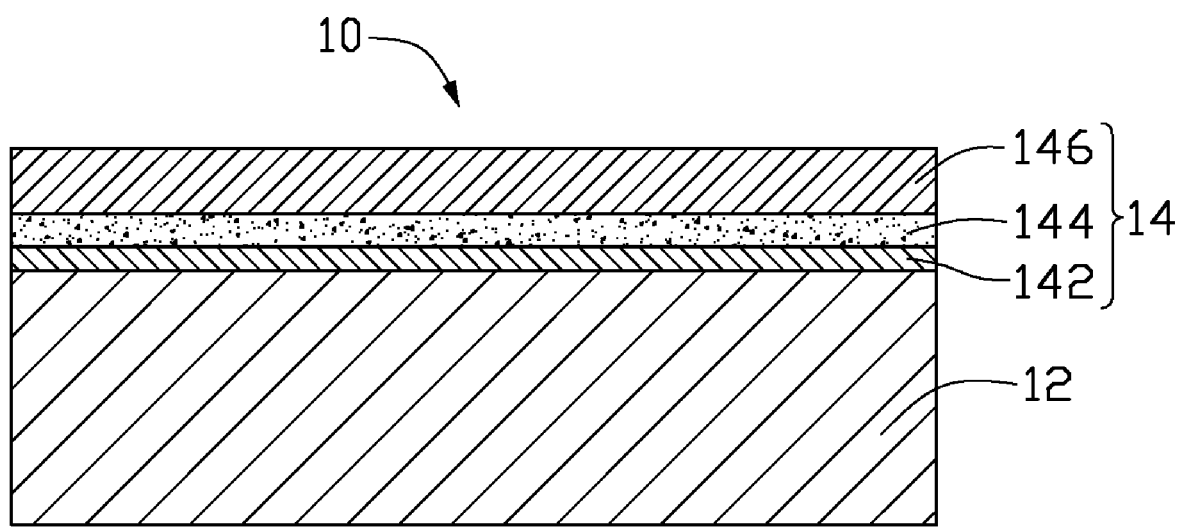
FIG. 1 is a side, cross-sectional view of a housing in accordance with a first preferred embodiment of the present invention.

Referring to FIG. 1, a housing 10 according to a first embodiment is shown. The housing 10 may be used for a portable electronic device, such as a mobile phone. The housing 10 includes a metallic glass main body 12 and a plurality of coatings 14 formed on the metallic glass main body 12. The coatings 14 include a plating layer 142, an adhesive layer 144, and an outer layer 146. The plating layer 142 connects to the metallic glass main body 12. The adhesive layer 144 is applied on the plating layer 142 for connecting the outer layer 146 to the plating layer 142. A thickness of the plating layer 142 is preferably in a range from about 0.01 microns to about 10 microns. A thickness of the adhesive layer 144 is preferably in a range from about 1 micron to about 20 microns. A thickness of the outer layer 146 is preferably in a range from about 10 microns to about 80 microns.

A material of the metallic glass main body 12 can include at least one of aluminum, iron, copper, titanium, nickel, cobalt, platinum, zirconium, columbium, silicon, boron, and beryllium, such as $Zr_{57}Nb_5Cu_{15.4}Ni_{12.6}Al_{10}$ and $Zr_{52.5}Cu_{17.9}Ni_{14.6}Al_{10}Ti_5$. Furthermore, to improve physical attractiveness of the housing 10, an outer surface of the metallic glass main body 12 is, preferably, smooth.

The plating layer 142 can be either electrically insulative or electrically conductive. A material of the plating layer 142 may be selected from the group consisting of stannum, aluminum, silicon-aluminum alloy, titanium, titanium carbide, titanium nitride, cadmium, indium, silicon dioxide, stainless steel, and any suitable combination thereof.

A material of the adhesive layer 144 is made of a polyolefin chloride, such as polyvinyl chloride and polypropylene chloride. In alternative embodiments, the adhesive layer 144 includes polyolefin chloride in an amount by weight from about 1% to about 99% and some additive materials. The additive material can be a polymer having one of a hydroxyl, amidogen, carboxyl, and epoxy group.

A material of the outer layer 146 includes acrylic resin.

An exemplary surface treating method for making the housing 10 is as follows. First, the plating layer 142 is formed on the metallic glass main body 12. Second, an adhesive is coated on the plating layer 142 to form an adhesive layer 144 on the plating layer 142. Third, a lacquer is coated on adhesive layer 144 to form an outer layer 146.

The process of forming the plating layer 142 can be done by performing a physical vapor deposition (PVD), a non-conductive vacuum metallization (NCVM) or a chemical vapor deposition (CVD) method. If the physical vapor deposition (PVD) or the non-conductive vacuum metallization method is used to prepare the plating layer 142, a plating material for the plating layer 142 may be a material selected from the group consisting of stannum, aluminum, silicon-aluminum alloy, titanium, titanium carbide, titanium nitride, cadmium, indium, silicon dioxide, stainless steel, and any suitable combination thereof. Excitation of the plating material can be performed by magneto-controlled sputter or plasma sputter. It should be pointed out that, if deposition is performed by the non-conductive vacuum metallization method, the plating layer 142 is electrically insulative.

The step of coating the adhesive is performed under a suitable temperature, such as normal temperature (20° C.). The adhesive is made of a polyolefin chloride, such as polyvinyl chloride and polypropylene chloride. In alternative embodiments, the adhesive layer 144 includes polyolefin chloride in an amount by weight from about 1% to about 99% and some additive materials. The additive material can be a polymer having one of a hydroxyl, amidogen, carboxyl, and epoxy group.

The step of coating the lacquer is performed by spraying or brush coating. The lacquer can be a transparent lacquer or a color lacquer. The lacquer can include acrylic resin. After being coated on the adhesive layer 144, the lacquer may further be leveled and solidified. The process of solidifying the lacquer is performed by a thermal curing method or a light curing method. For example, if the lacquer is an ultraviolet-cured lacquer, the process of solidifying the lacquer is preferably performed by a ultraviolet curing method.

The adhesive layer 144 increases a bonding strength between the plating layer 142 and the outer layer 146. Thus, the adhesive layer 144 prevents the outer layer 146 from detaching off the housing 10. Furthermore, the plating layer 142 is not easily damaged, and an appearance of the portable electronic device using the housing 10 is improved.

In this embodiment, the material of the adhesive layer 144 includes polyolefin chloride. Chlorine atoms of the adhesive layer 144 and metal atoms of the plating layer 142 would form chemical bonds, thereby enhancing the bonding strength of the plating layer 142 and the adhesive layer 144. Polymer chain of the adhesive layer 144 would combine with polymer chain of the outer layer 146, thereby enhancing the bonding strength of the adhesive layer 144 and the outer layer 146. Thus the outer layer 146 is tightly bonded on the housing 10. In addition, the outer layer 146 includes acrylic resin. Acrylic resin has elasticity, thereby making the outer layer 146 soft and comfortable when touched.

Furthermore, in the process of surface treating the housing 10, it easy to use various plating material to deposited the plating layer 142 or change the color of the lacquer for forming the outer layer 146. Therefore, the appearance of the housing 10 may meet different needs of the portable electronic device. In addition, if the plating layer 142 is deposited by a non-conductive vacuum metallization method, the plating layer 142 is electrically insulative. Thus the plating layer 142 would not interfere with electromagnetic waves or electrostatic discharge.

Figure 2:
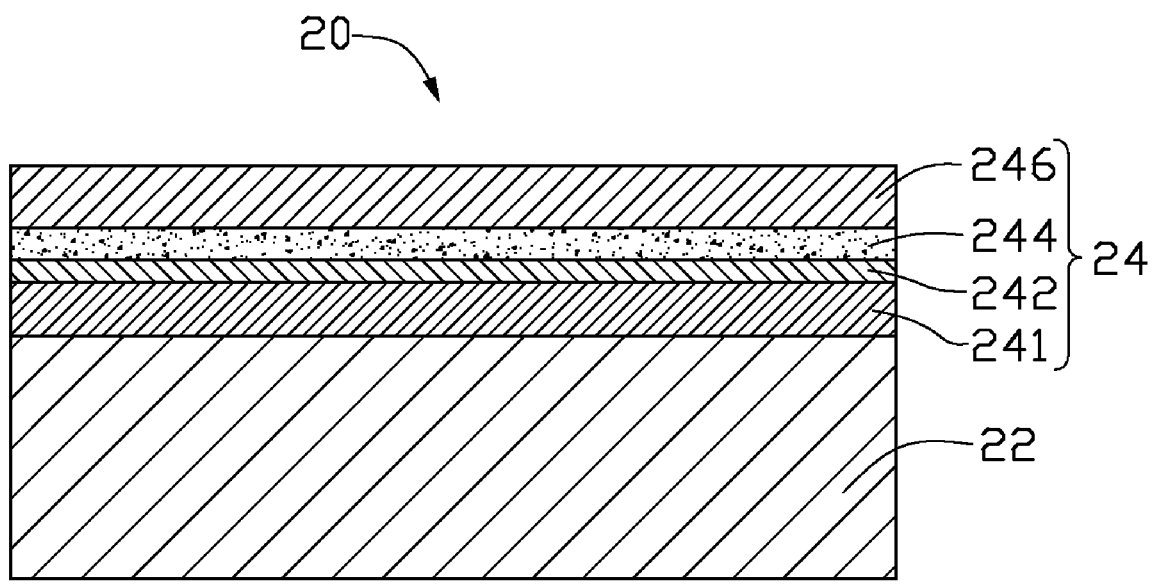
FIG. 2 is a side, cross-sectional view of a housing in accordance with a second preferred embodiment of the present invention.

Referring to FIG. 2, a housing 20 according to a second embodiment is shown. The housing 20 includes a metallic glass main body 22 and a plurality of coatings 24 formed on the metallic glass main body 22. The coatings 24 include a plating layer 242, an adhesive layer 244, and an outer layer 246. The housing 20 is similar in principle to the housing 10, however, the coatings 24 further includes a bottom layer 241. The bottom layer 241 is formed on the metallic glass main body 22, and connects to the plating layer 242. A thickness of the bottom layer 241 is preferably in a range from about 1 micron to about 30 microns. A surface treating method for making the housing 20 includes the following steps: first, coating a primer on a metallic glass main body, then leveling and solidifying the primer, thereby forming the bottom layer 241; second, forming the plating layer 242 on the bottom layer 241; third, coating an adhesive on the plating layer 242 to form an adhesive layer 244; finally, coating a lacquer on the adhesive layer 244 to form the outer layer 246. The primer may include acrylic resin. The process of solidifying the primer can be done by performing a thermal curing method or a light curing method. It should be understood that, with the help of the bottom layer 241, an appearance of the housing 20 can be improved, even if a surface of the metallic glass main body 22 that connects to the bottom layer 241 is zigzag.

Figure 3:
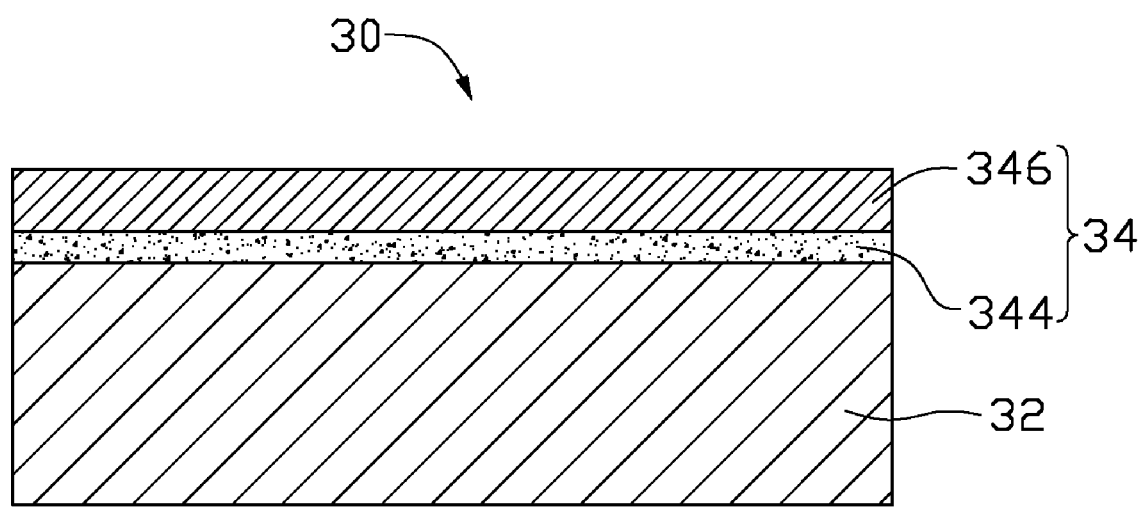
FIG. 3 is a side, cross-sectional view of a housing in accordance with a third preferred embodiment of the present invention.

It should be understood that, the plating layer 142 of the housing 10 can be omitted. Referring to FIG. 3, a housing 30 according to a third embodiment is shown. The housing 20 includes a metallic glass main body 32 and a plurality of coatings 34 formed on the metallic glass main body 32. The housing 30 is similar in principle to the housing 10. However, the coatings 34 include an adhesive layer 344 connecting to the main body 32, and an outer layer 346 on the adhesive layer 344.

It is noted that the scope of the present housing and surface treating method is not limited to the embodiments described above. In alternative embodiments, the portable electronic device can be a personal digital assistant, a MP3 player, or a MP4 player. The housings can also be utilized in some devices other than the portable electronic devices, such as a table computer. The surface treating method may be used for a workpiece other than the housing. In addition, a pattern layer may be formed on the metallic glasses main body, for example, in the housing 20, the bottom layer 241 can be made as a pattern layer with various patterns.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A housing comprising:
   a metallic glass main body; and
   at least two coatings formed on the metallic glass main body, the coatings comprising:
   an adhesive layer on the metallic glass main body;
   an outer layer formed on the adhesive layer;
   a plating layer sandwiched between the adhesive layer and the metallic glass main body; and
   a bottom layer formed by primer connecting to the metallic glass main body, the plating layer and the adhesive layer sandwiched between the bottom layer and the outer layer.

2. The housing as claimed in claim 1, wherein a material of the metallic glass main body comprises at least one of aluminum, iron, copper, titanium, nickel, cobalt, platinum, zirconium, columbium, silicon, boron, and beryllium.

3. The housing as claimed in claim 1, wherein a thickness of the adhesive layer is in a range from about 1 micron to about 20 microns.

4. The housing as claimed in claim 1, wherein a material of the plating layer is selected from the group consisting of stannum, aluminum, silicon-aluminum alloy, titanium, titanium carbide, titanium nitride, cadmium, indium, silicon dioxide, stainless steel, and any combination thereof.

5. The housing as claimed in claim 1, wherein the plating layer is electrically insulative.

6. The housing as claimed in claim 1, wherein a thickness of the plating layer is in a range from about 0.01 microns to about 10 microns.

7. The housing as claimed in claim 1, wherein a thickness of the bottom layer is in a range from about 1 micron to about 30 microns.

8. The housing as claimed in claim 1, wherein a material of the outer layer comprises acrylic resin.

9. The housing as claimed in claim 1, wherein a thickness of the outer layer is in a range from about 10 microns to about 80 microns.

10. The housing as claimed in claim 1, wherein the primer comprises acrylic resin.

11. The housing as claimed in claim 1, wherein a material of the adhesive layer comprises polyolefin chloride.

12. The housing as claimed in claim 11, wherein the material of the adhesive layer further comprises a polymer having one of a hydroxyl, amidogen, carboxyl, and epoxy group.

* * * * *